United States Patent
Tai et al.

(10) Patent No.: US 6,950,783 B1
(45) Date of Patent: Sep. 27, 2005

(54) METHOD AND RELATED SYSTEM FOR SEMICONDUCTOR EQUIPMENT PREVENTION MAINTENANCE MANAGEMENT

(75) Inventors: Hung-En Tai, Taipei Hsien (TW); Chien-Chung Chen, Hsin-Chu (TW); Sheng-Jen Wang, Hsin-Chu (TW)

(73) Assignee: Powerchip Semiconductor Corp., Hsin-Chu (TW)

( * ) Notice: Subject to any disclaimer, the term of this patent is extended or adjusted under 35 U.S.C. 154(b) by 15 days.

(21) Appl. No.: 10/708,572

(22) Filed: Mar. 11, 2004

(51) Int. Cl.[7] .............................................. G06F 19/00
(52) U.S. Cl. .................... 702/184; 702/84; 702/182; 702/183; 702/185; 702/187; 700/108; 438/5
(58) Field of Search .................... 702/84, 176, 177, 702/178, 182, 183, 184, 185, 187; 705/7, 705/11; 451/11, 8; 438/5; 700/12, 14, 17, 700/19, 108, 117, 121, 174–176, 178, 180

(56) References Cited

U.S. PATENT DOCUMENTS

| | | | |
|---|---|---|---|
| 5,327,349 A * | 7/1994 | Hoste | 700/110 |
| 5,910,011 A * | 6/1999 | Cruse | 438/16 |
| 6,090,632 A * | 7/2000 | Jeon et al. | 438/14 |
| 6,432,824 B2 * | 8/2002 | Yanagisawa | 438/691 |
| 6,556,949 B1 * | 4/2003 | Lyon | 702/182 |
| 6,629,009 B1 * | 9/2003 | Tamaki | 700/108 |
| 6,739,947 B1 * | 5/2004 | Molnar | 451/8 |
| 6,782,302 B1 * | 8/2004 | Barto et al. | 700/101 |
| 6,810,359 B2 * | 10/2004 | Sakaguchi | 702/182 |
| 2001/0049618 A1 * | 12/2001 | Patzel et al. | 705/8 |
| 2002/0064389 A1 * | 5/2002 | Semma et al. | 399/12 |
| 2004/0115841 A1 * | 6/2004 | Molnar | 438/5 |

* cited by examiner

Primary Examiner—Carol S. W. Tsai
(74) Attorney, Agent, or Firm—Winston Hsu

(57) ABSTRACT

A method and related system for semiconductor equipment prevention maintenance management. The method includes recording process parameters of each piece of equipment, recording equipment parameters when each piece of equipment is processing, evaluating and recording time and cost of prevention maintenance after each piece of equipment runs prevention maintenance, evaluating the quality of semiconductor products, and analyzing a relationship between the corresponding process parameter, the corresponding equipment parameters, prevention maintenance cost, and semiconductor products of each piece of equipment.

18 Claims, 3 Drawing Sheets

METHOD AND RELATED SYSTEM FOR SEMICONDUCTOR EQUIPMENT PREVENTION MAINTENANCE MANAGEMENT

BACKGROUND OF INVENTION

1. Field of the Invention

The present invention relates to a method and related system for semiconductor equipment management, and more particularly, to a method and related system for semiconductor equipment prevention maintenance management.

2. Description of the Prior Art

In semiconductor processing, each piece of semiconductor equipment runs prevention maintenance to modify the efficiency the piece of semiconductor equipment and semiconductor processing during a period, which provides more objective standards for testing data of semiconductor products. In the prior art, prevention maintenance of semiconductor equipments is performed by an experienced manufacturing engineer, who measures data to analyze and perform prevention maintenance of the semiconductor equipment according to the analytic results. However, the analytic results must been judged and evaluated by the manufacturing engineer to perform prevention maintenance. In addition, analytic knowledge of the semiconductor process is based on the analytic results according to some test items, including the efficiency of the semiconductor equipments, data measures of the semiconductor process, and prevention maintenance costs of the semiconductor equipment. The analytic results are not integrated to provide whole reference data for prevention maintenance of semiconductor equipment. Prevention maintenance knowledge is usually lost when manufacturing engineers leave the company, which causes a great loss to the manufacturer.

SUMMARY OF INVENTION

It is therefore an objective of the claimed invention to provide a method and related system for semiconductor prevention maintenance management, to solve the above-mentioned problem.

According to the claimed invention, a method and related system for semiconductor prevention maintenance management are disclosed, wherein each piece of equipment processes a plurality of semiconductor products according to at least one corresponding process parameter. The method comprises recording each process parameter of each piece of equipment, recoding processing conditions of each piece of equipment as at least one corresponding equipment parameter when each piece of equipment is processing, evaluating and recording time and cost of prevention maintenance after each piece of equipment has run prevention maintenance, evaluating the quality of semiconductor products after each semiconductor product has been processed, and analyzing a relationship between the corresponding process parameter, the equipment parameters, prevention maintenance cost, and the semiconductor product quality of each piece of equipment.

It is an advantage of the claimed invention that the method and related system of semiconductor prevention maintenance management analyze and gather statistics of the semiconductor equipment that have run prevention maintenance, and provide the analytic results in charts and tables to remote users through a network. The analytic results provide the functions of prevention maintenance management such as stability monitor, process modification and monitor, equipment difference modification and monitor, period evaluation and modification of prevention maintenance, and cost control of prevention maintenance components.

These and other objectives of the claimed invention will no doubt become obvious to those of ordinary skill in the art after reading the following detailed description of the preferred embodiment that is illustrated in the various figures and drawings.

DETAILED DESCRIPTION

Figure 1:
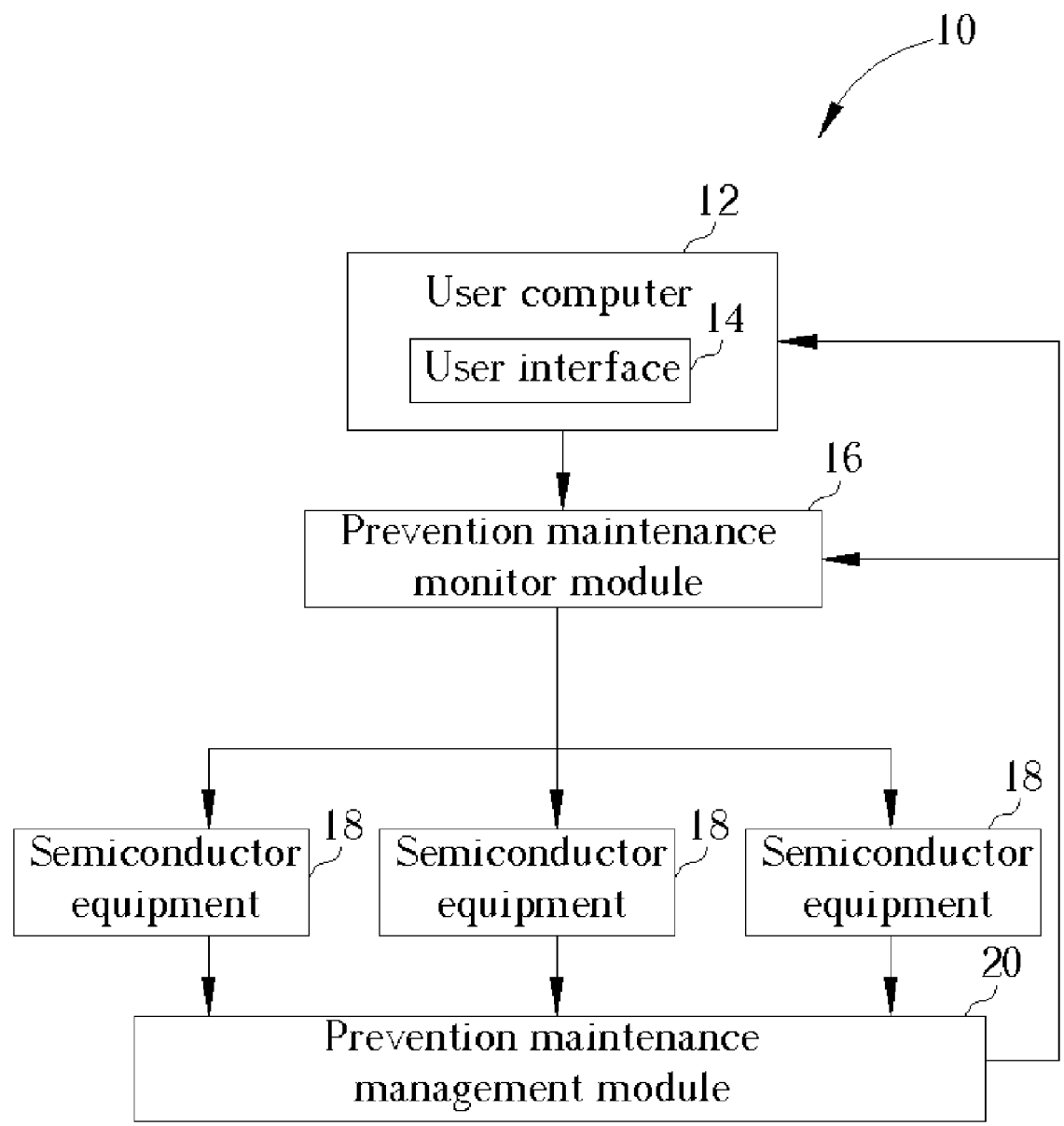
FIG. 1 is a diagram of a prevention maintenance system for semiconductor equipment according to the present invention.

Please refer to FIG. 1. FIG. 1 is a diagram of a prevention maintenance system 10 for semiconductor equipment according to the present invention. The prevention maintenance system 10 comprises a user computer 12, a prevention maintenance monitor module 16, a plurality of semiconductor equipment 18, and a prevention maintenance management module 20. The user computer 12 comprises a user interface 14 as a man-machine interface. The user computer 12 is connected to the prevention maintenance monitor module 16, and users use the user interface 14 to control the prevention maintenance monitor module 16 to process prevention maintenance of the semiconductor equipment 18. The prevention maintenance monitor module 16 is connected to each piece of the semiconductor equipment 18 to process prevention maintenance according to users modification. Each piece of semiconductor equipment 18 is connected to the prevention maintenance management module 20, and the prevention maintenance management module 20 is connected to the user computer 12 and the prevention maintenance monitor module 16. When each piece of semiconductor equipment processes a semiconductor, the prevention maintenance management module 20 records some parameters of the semiconductor process and testing results to analyze and integrate, and transmits the analytic results to the remote user computer 12 through a network. The analytic results are shown in the user interface 14 using charts and tables. In addition, the prevention maintenance management module 20 also transmits the analytic results to the prevention maintenance monitor module 16, which forms a monitor feedback interface through the user interface 14 to allow users to monitor and modify prevention maintenance of the semiconductor equipment in real-time.

Figure 2:
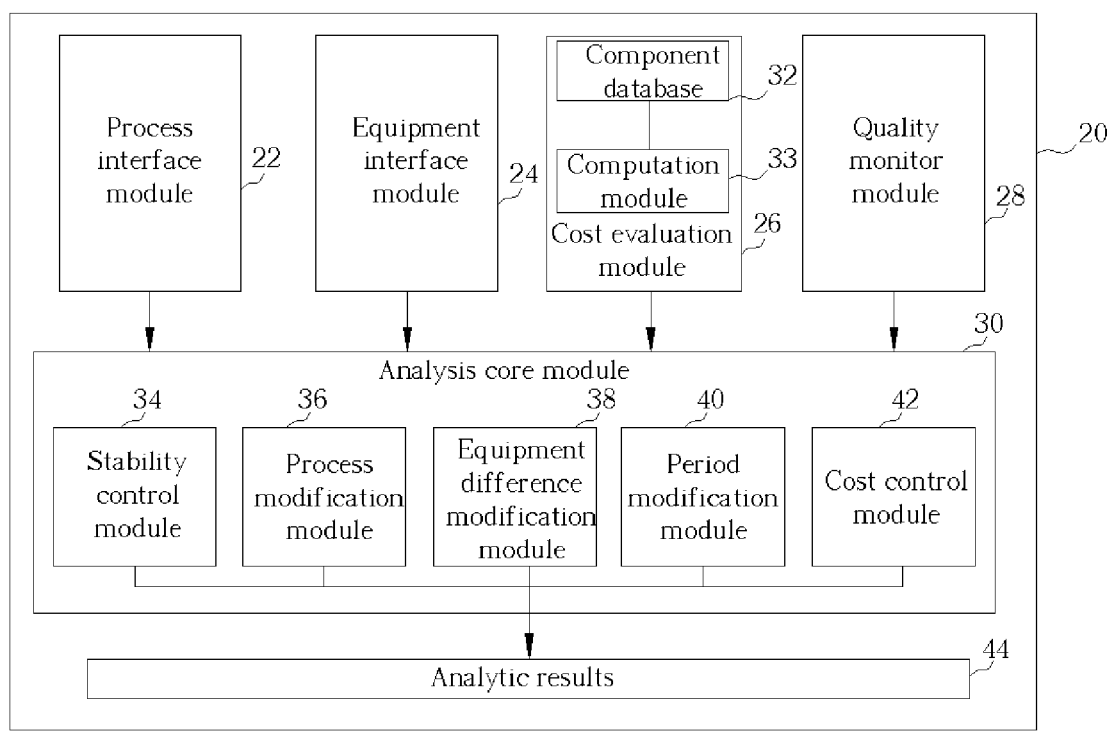
FIG. 2 is a functional block diagram of the prevention maintenance management module shown in FIG. 1.

Please refer to FIG. 2. FIG. 2 is a functional block diagram of the prevention maintenance management module 20 shown in FIG. 1. The prevention maintenance management module 20 comprises a process interface module 22, an equipment interface module 24, a cost evaluation module 26, a quality monitor module 28, and an analysis core module 30. The cost evaluation module 26 comprises a component database 32 and a computation module 33. After each piece of semiconductor equipment 18 shown in FIG. 1 processes a plurality of semiconductor products according to the corresponding parameter, the process interface module 22 receives and records the corresponding process parameter of each piece of semiconductor equipment 18. When each piece of semiconductor equipment 18 is processing, the equipment interface module 24 records processing conditions of each piece of semiconductor equipment 18 as the corresponding equipment parameters. After each piece of semiconductor equipment 18 processes the corresponding prevention maintenance, the computation module 33 of the cost evaluation module 26 computes and evaluates a prevention maintenance cost according to the component cost recorded in the component database 32. After each piece of semiconductor equipment 18 has processed, the quality monitor module 28 records the quality of each semiconductor product according to the base line rectified after prevention maintenance.

The analysis core module 30 is connected to the process interface module 22, the equipment interface module 24, the cost evaluation module 26, and the quality monitor module 28 for analyzing and gather statistics of the relationships between the corresponding process parameter, the corresponding equipment parameters, prevention maintenance cost, and the semiconductor product quality of each piece of semiconductor equipment 18. The analysis core module 30 comprises a stability control module 34, a process modification module 36, an equipment difference modification module 38, a period modification module 40, and a cost control module 42. Each module uses a T-test, a one-way analysis of variance (ANOVA), a two-way analysis of variance, or box plots to analyze and gather statistics. The analytic results 44 are then transmitted to the user computer 12 and the prevention maintenance monitor module 16 shown in FIG. 1. The stability control module 34 evaluates and controls the stability of the semiconductor equipment 18. The process control module 36 modifies and monitors the standard operating procedure (SOP) of the semiconductor process. The equipment difference modification module 38 modifies and monitors equipment differences between each piece of semiconductor equipment 18. The period modification module 40 evaluates and modifies the best period of prevention maintenance. The cost control module 42 evaluates if the prevention maintenance cost is within a specific range, that is, if the prevention maintenance cost is reasonable. According to operation of each module in the analysis core module 30, the relationships between process parameters, equipment parameter, prevention maintenance cost, and the semiconductor product quality can be used to evaluate and manage the prevention maintenance. For example, if the semiconductor product quality after a prevention maintenance process is similar to that before the prevention maintenance process, this indicates the prevention maintenance process is unnecessary so that the period of the prevention maintenance can be increased. Similarly, the cost of prevention maintenance is evaluated according to the improving level of semiconductor product quality after prevention maintenance. In addition, the quality, time, and cost of the substituted components are also evaluated.

Figure 3:
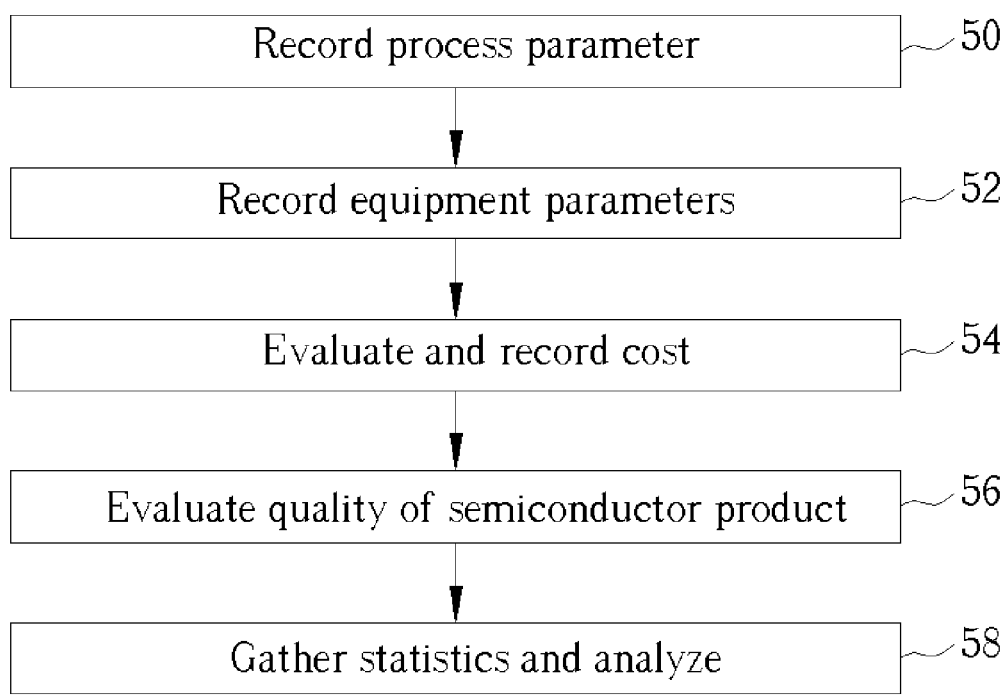
FIG. 3 is a flow chart of the prevention maintenance method for semiconductor equipments according to the present invention.

Please refer to FIG. 3. FIG. 3 is a flowchart of the prevention maintenance method for semiconductor equipments according to the present invention. The flowchart comprises the following steps:

Step 50: Processing a plurality of semiconductor products according to at least one corresponding process parameter using each piece of semiconductor equipment 18, and recording each process parameter of each semiconductor equipment 18 using the process interface module 22.

Step 52: Recoding processing conditions of each piece of equipment 18 as the corresponding equipment parameters when each semiconductor equipment 18 is processing using the equipment interface module 24.

Step 54: Evaluating and recording time and cost of prevention maintenance after each piece of semiconductor equipment 18 has run prevention maintenance according to component records in the component database using the cost evaluation module 26.

Step 56: Recording the quality of semiconductor products according the rectified base line after each semiconductor equipment 18 has processed using the quality monitor module 28.

Step 58: Using a T-test, a one-way analysis of variance (ANOVA), a two-way analysis of variance, or box plots to analyze, and transmitting the analytic results 44 to the user computer 12 and the prevention maintenance monitor module 16 shown in FIG. 1 using the analysis core module 30.

The above-mentioned method for semiconductor equipment prevention maintenance management analyzes and gathers statistics of testing results, presents wafer data and statistics of semiconductor products in tables according to processing lots, wafers, and equipments. The wafer data includes processing steps, processing lots, chambers, processing time, etc. The statistics include wafer testing data for wafer functionality, sample testing data for electric test, final testing data of chip package, measuring data and yield value of each wafer layer or each processing module. The statistics can be shown in the way of a T-test, a one-way analysis of variance (ANOVA), a two-way analysis of variance, or box plots and presented by charts and tables, which provide trend charts of data to perform semiconductor equipment prevention maintenance management according to testing data.

In contrast to the prior art, the method and related system of semiconductor prevention maintenance management analyze and gather statistics of the semiconductor equipment that have run prevention maintenance, and provide the analytic results in charts and tables to remote users through a network. The analytic results provide stability monitor, process modification and monitor, equipment difference modification and monitor, period evaluation and modification of prevention maintenance, and cost control of prevention maintenance components.

Those skilled in the art will readily observe that numerous modifications and alterations of the device may be made while retaining the teachings of the invention. Accordingly, that above disclosure should be construed as limited only by the metes and bounds of the appended claims.

What is claimed is:

1. A method for prevention maintenance management of at least one piece of semiconductor equipment, each piece of equipment processing a plurality of semiconductor products according to at least one corresponding process parameter, the method comprising:

recording each process parameter of each piece of equipment;

recoding processing conditions of each piece of equipment as at least one corresponding equipment parameter when each piece of equipment is processing;

evaluating and recording time and cost of prevention maintenance after each piece of equipment has run prevention maintenance, evaluating the quality of semiconductor products after each semiconductor product has been processed; and analyzing a relationship between the corresponding process parameter, the equipment parameters, prevention maintenance cost, and the semiconductor product quality of each piece of equipment.

2. The method of claim 1, wherein the step of evaluating the cost further comprises:
   recording components used in prevention maintenance of each piece of equipment; and
   evaluating prevention maintenance cost according to the component cost.

3. The method of claim 1, wherein the step of analyzing further comprises:
   evaluating if the cost of prevention maintenance is within a specific range.

4. The method of claim 1, wherein the step of analyzing further comprises:
   evaluating the prevention maintenance period of a piece of equipment.

5. The method of claim 1, wherein the step of evaluating the quality of each semiconductor product is according to the rectified base line of the semiconductor product quality after prevention maintenance.

6. The method of claim 1, further comprising:
   rectifying prevention maintenance and standard operating procedure (SOP) according to the relationship of the corresponding process parameter, the corresponding equipment parameters, prevention maintenance cost, and the semiconductor product quality.

7. The method of claim 1, further comprising:
   rectifying prevention maintenance and evaluating quality and cost of substituted components according to the relationship of the corresponding process parameter, the corresponding equipment parameters, prevention maintenance cost, and the semiconductor product quality.

8. The method of claim 1, wherein the step of analyzing uses a T-test, a one-way analysis of variance (ANOVA), a two-way analysis of variance, or box plots to analyze.

9. The method of claim 1, further comprising:
   feedback monitoring to transmit the analytic results to a user through a network or a man-machine interface.

10. A system for prevention maintenance management of at least one piece of semiconductor equipment, each piece of equipment processing a plurality of semiconductor products according to at least one corresponding process parameter, the system comprising:
   a process interface module for recording each process parameter of each piece of equipment;
   an equipment interface module for recoding processing conditions of each piece of equipment as at least one corresponding equipment parameter when each piece of equipment is processing;
   a cost evaluation module for evaluating and recording time and cost of prevention maintenance after each piece of equipment has run prevention maintenance;
   a quality monitor module for evaluating the quality of semiconductor products after each semiconductor product has been processed; and
   an analysis core module for analyzing a relationship between the corresponding process parameter, the equipment parameters, prevention maintenance cost, and the semiconductor product quality of each piece of equipment.

11. The system of claim 10, wherein the cost evaluation module further comprises:
   a component database for recording components used in prevention maintenance of each piece of equipment; and
   a computation module for evaluating prevention maintenance cost according to component cost.

12. The system of claim 10, wherein the analysis core module further evaluates if the cost of prevention maintenance is within a specific range.

13. The system of claim 10, wherein the analysis core module further evaluates the prevention maintenance period of a piece of equipment.

14. The system of claim 10, wherein the quality monitor module evaluates the quality of each semiconductor product according to the rectified base line of the semiconductor product quality after prevention maintenance.

15. The system of claim 10, wherein the analysis core module further rectifies prevention maintenance and standard operating procedure.

16. The system of claim 10, wherein the analysis core module further rectifies prevention maintenance and evaluates the quality and cost of substituted components.

17. The system of claim 10, wherein a T-test, a one-way analysis of variance, a two-way analysis of variance, or box plots are used to analyze.

18. The system of claim 10, further comprising:
   a monitor feedback interface for transmitting the analytic results to a user through a network or a man-machine interface.

* * * * *